(12) United States Patent
Pelletier et al.

(10) Patent No.: US 9,703,014 B2
(45) Date of Patent: Jul. 11, 2017

(54) PROTECTIVE COATING FOR OPTICAL ELEMENTS

(71) Applicant: Halliburton Energy Services, Inc., Houston, TX (US)

(72) Inventors: Michael T. Pelletier, Houston, TX (US); Christopher Michael Jones, Houston, TX (US); Robert S. Atkinson, Richmond, TX (US); Wei Zhang, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/341,120

(22) Filed: Nov. 2, 2016

(65) Prior Publication Data

US 2017/0108624 A1    Apr. 20, 2017

Related U.S. Application Data

(62) Division of application No. 14/777,958, filed as application No. PCT/US2013/038056 on Apr. 24, 2013, now Pat. No. 9,529,145.

(51) Int. Cl.

| | | |
|---|---|---|
| *G02B 1/10* | (2015.01) | |
| *G02B 6/036* | (2006.01) | |
| *G01V 8/10* | (2006.01) | |
| *G02B 1/14* | (2015.01) | |
| *G02B 6/44* | (2006.01) | |
| *C23C 14/18* | (2006.01) | |

(52) U.S. Cl.
CPC .............. *G02B 1/14* (2015.01); *C23C 14/185* (2013.01); *G01V 8/10* (2013.01); *G02B 6/036* (2013.01); *G02B 6/4427* (2013.01)

(58) Field of Classification Search
CPC ............. G02B 1/10; G02B 6/02; G02B 6/036
See application file for complete search history.

(56) References Cited

U.S. PATENT DOCUMENTS 3,971,645 A * 7/1976 Bachmann ............ C03B 37/018
                                                      385/123
4,432,606 A    2/1984 Blair
(Continued)

FOREIGN PATENT DOCUMENTS

JP    2005-208025 A    8/2005

OTHER PUBLICATIONS

International Search Report and Written Opinion issued in related Application No. PCT/US2013/038056, mailed Jan. 21, 2014 (10 pages).

*Primary Examiner* — Ryan Lepisto
(74) *Attorney, Agent, or Firm* — Alan Bryson; Baker Botts L.L.P.

(57) ABSTRACT

An optical element devices and method are described herein. An example optical device may include an optical element. The optical element may have an optical path material to allow a light to pass therethrough. The optical path material may have a first end portion with a first end surface, a second end portion with a second end surface, and a middle portion between the first and second end portions with an interior and an exterior surface. A coating may be disposed along the exterior surface and diffused into the optical path material. The coating may minimize leakage of the light from the interior through the exterior surface.

10 Claims, 3 Drawing Sheets

(56) References Cited

U.S. PATENT DOCUMENTS

| | | | | |
|---|---|---|---|---|
| 4,597,787 | A | * | 7/1986 | Jacobson .............. C03B 37/018 427/163.2 |
| 6,807,353 | B1 | * | 10/2004 | Fleming ................ B82Y 20/00 385/129 |
| 2003/0135971 | A1 | * | 7/2003 | Liberman .......... B01D 67/0041 29/419.1 |
| 2012/0039359 | A1 | * | 2/2012 | MacDougall .......... G01K 11/32 374/161 |

* cited by examiner

PROTECTIVE COATING FOR OPTICAL ELEMENTS

CROSS-REFERENCE TO RELATED APPLICATIONS

This application is a divisional of U.S. patent application Ser. No. 14/777,958, which was filed on Sep. 17, 2015 and is a National Stage Application of International Application No. PCT/US2013/038056, filed on Apr. 24, 2013, all of which are hereby incorporated by reference in their entirety.

BACKGROUND

The present disclosure relates generally to optical systems and, more particularly, to a protective coating for optical elements.

Conventional optical elements typically acquire light from a light source at a first surface, transmit the light through an internal structure, and deliver the light through a second surface. Example optical elements include optical fibers or waveguides that may be used to transmit light between two ends for the purpose of relaying information. As light travels within the internal structure some light may be lost. Likewise, environmental light may enter the optical element, combining with the light from the light source. In certain instances, this can result in decreased brightness levels of delivered light, a decrease in the rate of transmission, and a decrease in the fidelity of an optical system incorporating the optical element.

BRIEF DESCRIPTION OF THE DRAWINGS

Some specific exemplary embodiments of the disclosure may be understood by referring, in part, to the following description and the accompanying drawings.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates generally to optical systems and, more particularly, to protective coating for optical elements.

Illustrative embodiments of the present disclosure are described in detail herein. In the interest of clarity, not all features of an actual implementation may be described in this specification. It will of course be appreciated that in the development of any such actual embodiment, numerous implementation specific decisions must be made to achieve the specific implementation goals, which will vary from one implementation to another. Moreover, it will be appreciated that such a development effort might be complex and time consuming, but would nevertheless be a routine undertaking for those of ordinary skill in the art having the benefit of the present disclosure. To facilitate a better understanding of the present disclosure, the following examples of certain embodiments are given. In no way should the following examples be read to limit, or define, the scope of the disclosure.

For purposes of this disclosure, an optical element may include any lens, waveguide, window, filter, prism, MOE (multivariate optical element), image rod, homogenizer, integrator, optical fiber, part of an optical fiber (as in an end attachment), or any other suitable optic. As will be apparent from the present disclosure, certain embodiments may prevent or minimize light leakage at an interface of an optical element with the environment. Certain embodiments may provide for higher transmission of acquired light and brighter light delivered, for non-limiting example, to a sample and on to a detector. Certain embodiments may prevent or decrease an amount of stray light and provide for higher system fidelity. Certain embodiments may provide for increased signal-to-noise ratio for an optical system, for non-limiting example, in implementations involving spectroscopy, Raman spectroscopy, or telemetry. Certain embodiments may provide for higher signals and increased ruggedness of optical elements.

Figure 1A:
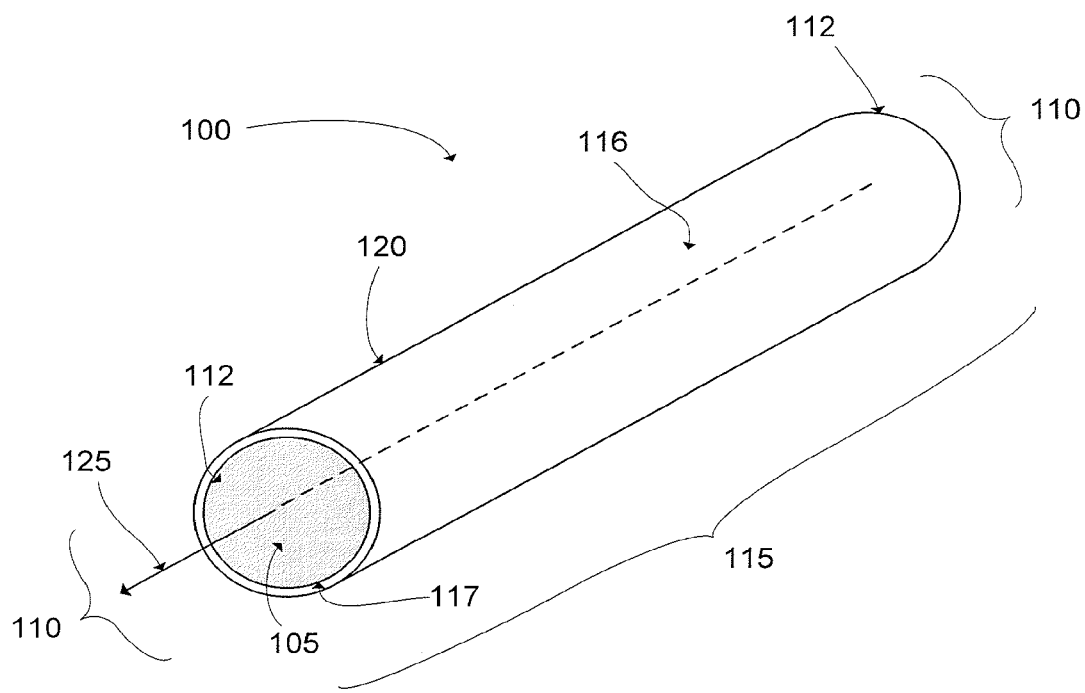
FIG. 1A is a diagram showing a perspective view an example optical element, in accordance with certain embodiments of the present disclosure.
Figure 1B:
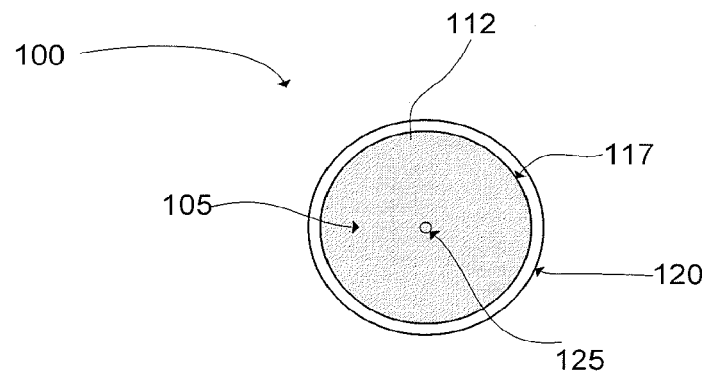
FIG. 1B is a diagram showing an end view of the optical element of FIG. 1A, in accordance with certain embodiments of the present disclosure.

FIG. 1A is a diagram showing a perspective view of an optical element 100, in accordance with certain embodiments of the present disclosure. FIG. 1B is a diagram showing an end view of the optical element 100. The optical element 100 may include an optical path material 105. The optical path material 105 may include end portions 110 and a middle portion 115. The end portions 110 may each include an end surface 112. The middle portion 115 may include an interior 116 and one or more exterior surfaces 117 about the interior 116, spanning the distance between the end surfaces 112. A coating 120 may cover the one or more exterior surfaces 117 of the optical path material 105. The optical path material 105 may have any suitable form and, as in the non-limiting example depicted, may have a cylindrical form, with the exterior surface 117 and the coating 120 having corresponding cylindrical forms.

The optical path material 105 may allow a desired form of light or other electromagnetic radiation through the end surfaces 112 and the interior 116 and generally along an optical path 125. The optical path 125 may be a general indication of an overall path on, along, and/or about which the desired form of light may pass through the optical path material 105. The optical path material 105 may include any suitable material. By way of example without limitation, the optical path material 105 may include sapphire, calcium fluoride, or another optically transparent material.

As in the non-limiting example depicted, the coating 120 may cover the surface of the optical path material 105 that is parallel to the optical path 125. The coating 120 may include any suitable material of any suitable thickness including, but not limited to, a thin surface of gold, silver, or copper. The choice of material may be based, at least in part, on non-corrosiveness. The choice of material may be based, at least in part, on infrared reflective properties. Higher infrared reflective properties may be more desirable. The choice of material may be based, at least in part, on ductility to accommodate thermal stresses without pealing from the optical path material 105. Graded metallic coatings can be used to match materials of larger differences in thermal expansion. The coating 120 may be a graded refractive index coating, similar in concept to fiber optics, but where objectives may include protection of the exterior surface 117, prevention or minimization of light leakage from the interior 116 through the exterior surface 117, and/or a mechanical mounting and isolation function. The coating 120 may be applied by way of a sputtering and annealing process.

Figure 2:
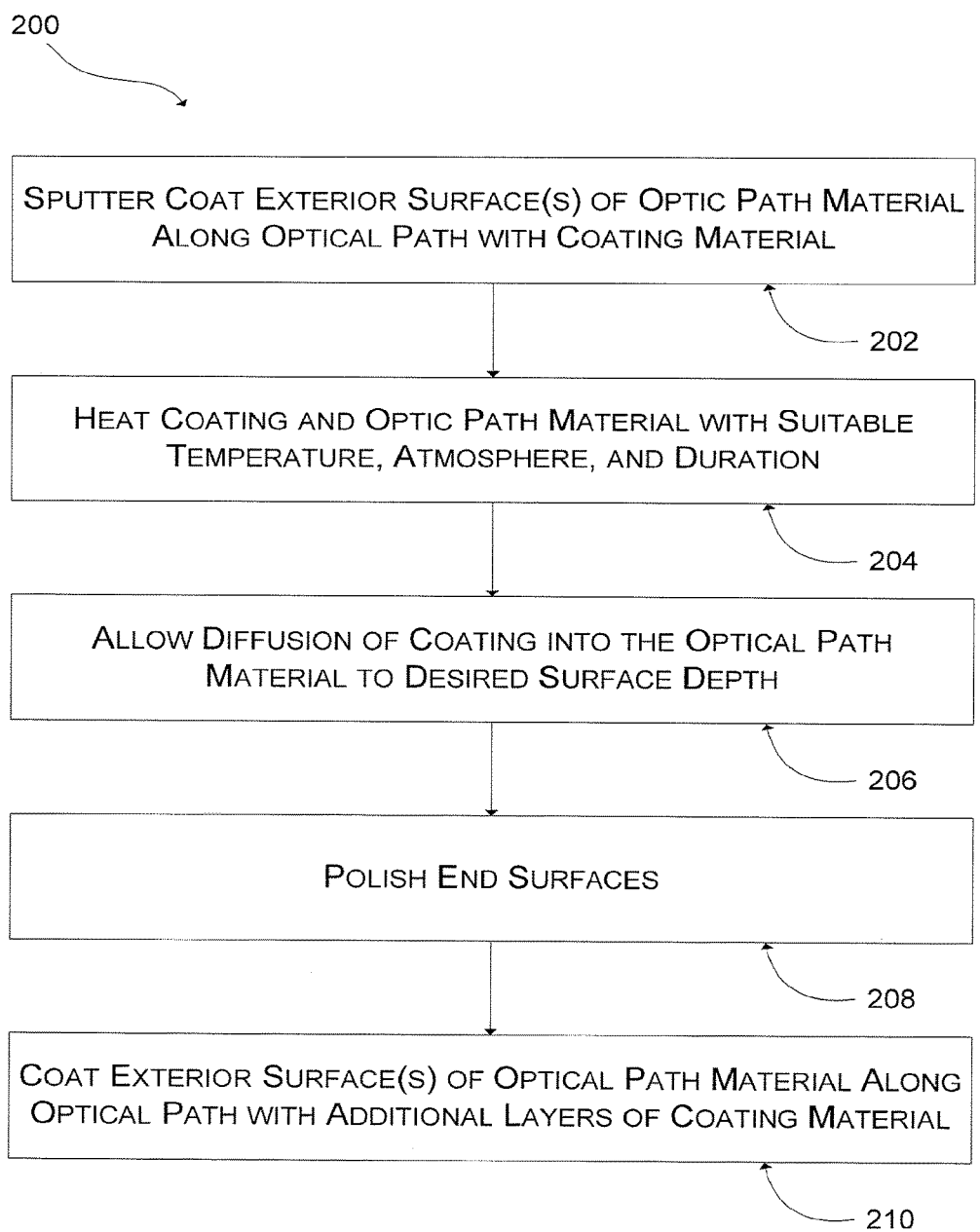
FIG. 2 is a flow diagram showing an example method of preparing an optical element, in accordance with certain exemplary embodiments of the present disclosure.

FIG. 2 is a flow diagram showing an example method 200 of preparing an optical element 100, in accordance with certain exemplary embodiments of the present disclosure. Teachings of the present disclosure may be utilized in a variety of implementations. As such, the order, combination, and/or performance of the steps comprising the method 200 may depend on the implementation chosen.

According to one example, the method 200 may begin at step 202. At step 202, the coating 120 may be applied by sputter coating the exterior surface 117 with the coating material. In certain embodiments, the exterior surface 117 of the optical path material 105 may include sapphire that is sputter coated with a thin surface of gold or silver.

At step 204, after the coating 120 has been applied, the coating 120 and the optical path material 105 may be heated. The heating may be done as an oven process or by local heating processes such as ion or electron beam heating and/or laser sintering The heating may facilitate diffusion of the coating 120 into the optical path and distribution and formation of the coating 120 on the optical path material 105. The heating may take place in an oxygen-devoid atmosphere in certain embodiments and may, for example, be nitrogen-purged. Any suitable temperature may be applied including, but not limited to, two-thirds ($\frac{2}{3}$) of melting temperatures of the optical path material 105 or the coating 120. The heat may be applied for any suitable duration of time. Certain embodiments may include applying heat for a duration of about 24 hours. Different embodiments may include different temperature/time combinations for the application of heat. Higher temperatures may require less time to allow diffusion of the coating 120 into the optical path and to distribute and form the coating 120 on the optical path material 105. However, temperature and time may be controlled so that neither the optical path material 105 nor the coating 120 reach their respective melting points. The heating process also may increase a mechanical durability of the coating 120. For example, heating to $\frac{1}{3}$ to $\frac{1}{2}$ the melting point of the base metal of the coating 120 may substantially remove voids from the coating 120 and increase its density. Likewise, the heating process may increase the adhesion of the coating 120 to the optical path material 105 from a weak adhesion to a more robust mechanical coating.

As indicated by step 206, part of the heating process may be to allow diffusion of the coating 120 into the optical path material 105 to a desired depth. In certain embodiments, the heating process may allow diffusion of the coating 120 into the optical path material 105 to a surface depth that is on the order or less than a wavelength of light that will be optically guided. In certain embodiments, the heating process may allow diffusion of the coating 120 into the optical path material 105 to a surface depth that is greater than a wavelength of light that will be optically guided. The depth of diffusion may be used to control the amount and wavelength of light that is passed through the optical path material 105. For example, as the coating diffuses in to the optical path material 105, the refractive index of the optical path material 105 may altered, and the governing equations for the optical path material 105 may change from geometric refraction to refractive index controlled equations. The refractive index controlled equations may be utilized to set the depth to allow some wavelengths of light to escape the optical path material 105. Diffusion penetration to greater depths may provide a less stark boundary of reflection, but may be desirable as well. Various coatings 120 and optical path materials 105 will have various diffusion properties and will subsequently require various temperature/time combinations. One consideration affecting the temperature/time combinations may be the balancing of diffusion with the stark reflection boundary desired.

The coating 120 may prevent or minimize light leakage at the interface of the optical element 100 with the environment. Light staying in the interior 116 of the optical element 100 may prevent dispersion via refractive angle and may minimize any spectroscopic signal due to absorptive vapors. The coating 120 may help the optical element 100 act as a light pipe. However, in certain embodiments, total internal reflection may be achieved by either refractive index or metallic reflection of the light.

The prevention or minimization of light leakage may greatly reduce the light loss at seals and support structures of devices implementing the optical element 100. In spectroscopic applications, light loss may be compounded by an interaction which leaves a portion of the light on its way to a detector carrying a spectral signature of a sealing material and any lubricant used in a seal assembly, which is a highly undesirable signal. A technique in which these interactions may be used to probe the material at the surface of the optical element 100 is known as Attenuated Total Reflection (ATR) spectroscopy.

The coating 120 may be used to shock isolate, prevent corrosion, and/or otherwise protect optical path materials 105. The coating 120 may be used to mount optical path materials 105 by, for example, providing attachment area where the optical element 100 may be glued or otherwise attached to other components. The coating 120 may limit light loss and optic degradation due to humidity and moisture. The coating 120 may limit system susceptibility to phantom spectra from assembly lubricants, cleaning solvents, and the like. The coating 120 may make components more robust in the manufacturing and field maintenance environment.

As indicated by step 208, after sufficient diffusion is achieved, the end surfaces 112 may be polished to remove any amount of coating material that may have been deposited on the end surfaces 112. At step 210, the exterior surface 117 may be additionally coated with the same or different coating material, including but not limited to, aluminum, silver, gold, germanium, any suitable inert metal, or any suitable material. Thus, in certain embodiments, the coating 120 may include two or more coating layers. The additional coating layer or layers may have a thickness much larger than the wavelength of light in certain embodiments, and may provide additional durability, ruggedness, and protection. The coating method of adding the additional layer(s) may include sputter coating or any other suitable coating method including, but not limited to, electroplating.

Figure 3:
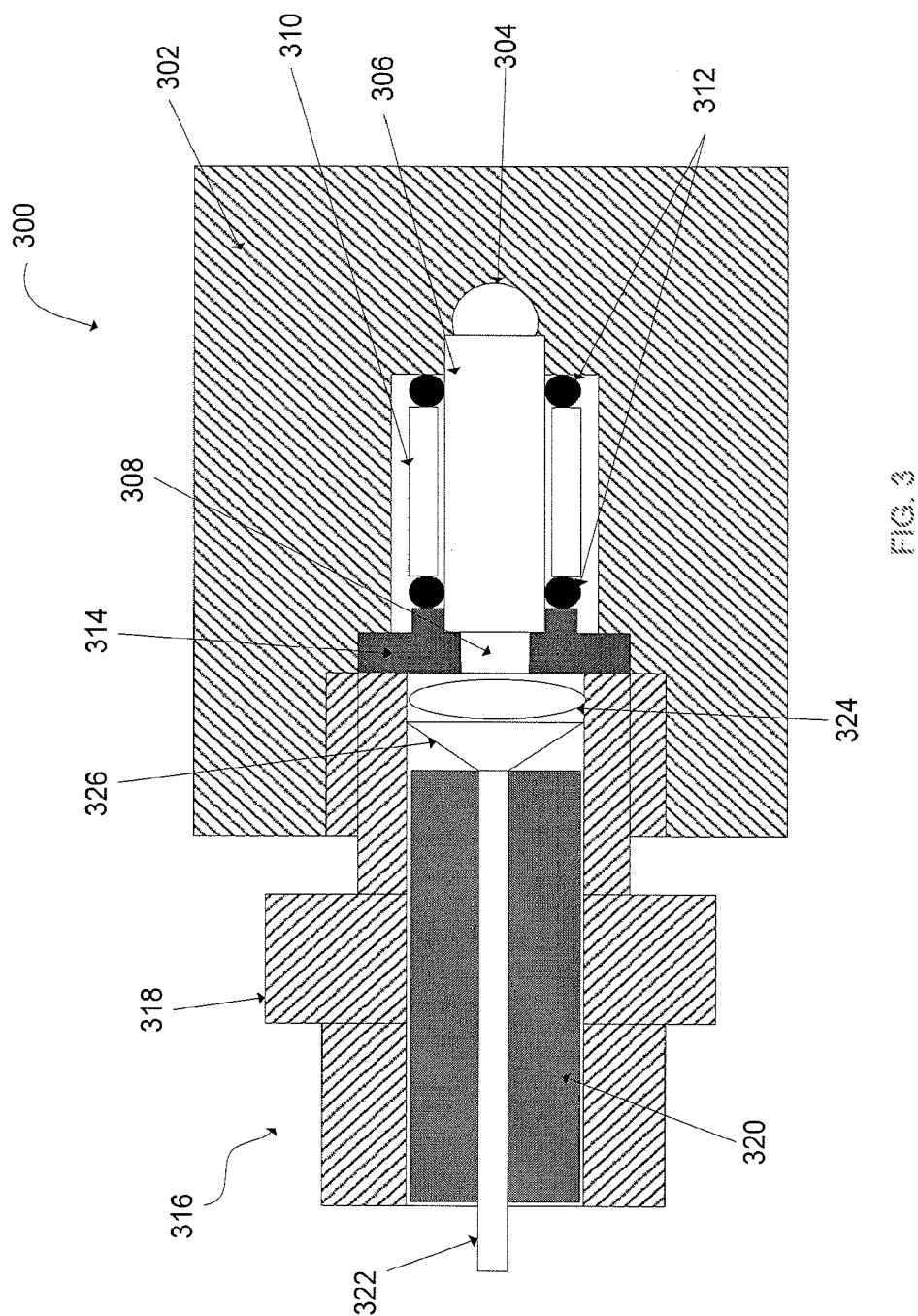
FIG. 3 is a diagram showing an example high-pressure optical system, in accordance with certain embodiments of the present disclosure.

FIG. 3 is a diagram showing an example high-pressure optical system 300, in accordance with certain embodiments of the present disclosure. The high-pressure optical system 300 may be one non-limiting example including an optical element 306, which may correspond to the optical element 100 described above. As will be apparent to those skilled in the art, many types of optical tools may incorporate the optical element 100, including implementations of the optical element 100 as windows or relays in spectroscopy.

The high-pressure optical system 300 may include a body 302 having a cavity 304 to hold a fluid for optical analysis. The optical element 306, which may include a window, may be disposed inside at least a portion of the body 302, adjacent to the cavity 304, and oriented to guide a desired light along an optical path between the cavity 304 and an aperture 308. The optical element 306 may be fitted and retained in at least a portion of the body 302 with one or more spacers 310, one or more seals 312 that may include but not be limited to o-rings or packing, and one or more stress distribution elements 314. A fiber optic connector assembly 316 may include one or more support bushings 318 and a bayonet 320 that supports a fiber optic 322 in alignment with the optical path. The fiber optic connector assembly 316 may include a lens 324 positioned between the aperture 308 and dispersed light 326 from the fiber optic 322. The above components may be formed of any desired material suitable for operation in the intended environment. In optical analysis systems such as optical system 300, a fluid can be introduced into the cavity 304, and light can be communicated through the fiber optic 322, lens 324, aperture 308, and optical element 306 to facilitate a desired optical measurement. The wavelength of light directed through the optical system 300 can be selected in accordance with the fluid under examination and/or the fluid property to be evaluated. As described above, the optical element 306 may have a coating applied to an optical path material via sputtering and annealing processes and diffused into the optical path material a distance based, at least in part, on the wavelength of the light used.

With time and use, the seals 312 may acquire a film of the fluid under test and would begin to contaminate readings of a conventional optic even after repeated aggressive cleaning. However, in contrast to the conventional devices, the optical element 306 of the present disclosure may used to overcome fluid phantom spectra from seepage of fluids into seals and packing. As described above, the optical element 306 may prevent or minimize light leakage at the interface of the optical element 306 with the surrounding portions of the optical system 300. Light staying in the optical element 306 may prevent dispersion via refractive angle and may minimize or prevent phantom spectra and light loss at seals and support structures.

In certain embodiments, an optical element similar to optical element 100 or a high-pressure optical system similar to high-pressure optical system 300 may be used in a downhole environment for optical testing. For example an optical element according to aspects of the present disclosure, or an entire optical system incorporating such an optical element, may be incorporated into a wireline tool or a logging-while-drilling (LWD) or measuring-while-drilling (MWD) apparatus. Optical tests using the optical element may then be performed downhole, on fluid samples taken directly from the formation or borehole. Various configurations are possible as would be appreciated by one of ordinary skill in the art in view of this disclosure.

Downhole environments are typically characterized by harsh conditions including high temperatures and pressures, and the presence of particulate matter. Accordingly, in downhole environments and other harsh environments, the coating on the optical element may be strengthened to prevent damage, which may reduce the effectiveness of the optical element. In certain embodiments, the coating may include a metallic layer, or a layer of the coating may include metallic additives. These metallic-coated optical elements may better protect the optical path material from damage due to the harsh environment conditions.

Even though the figures depict embodiments of the present disclosure in a particular orientation, it should be understood by those skilled in the art that embodiments of the present disclosure are well suited for use in a variety of orientations. Accordingly, it should be understood by those skilled in the art that the use of directional terms such as above, below, upper, lower, upward, downward, higher, lower, and the like are used in relation to the illustrative embodiments as they are depicted in the figures, the upward direction being toward the top of the corresponding figure and the downward direction being toward the bottom of the corresponding figure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. While certain embodiments described herein may include some but not other features included in other embodiments, combinations of features of various embodiments in any combination are intended to be within the scope of this disclosure. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that the particular article introduces; and subsequent use of the definite article "the" is not intended to negate that meaning.

What is claimed is:

1. A method of preparing an optical device, the method comprising:
    providing an optical path material to allow a light to pass therethrough, the optical path material including
        a first end portion comprising a first end surface;
        a second end portion comprising a second end surface; and
        a middle portion between the first and second end portions and comprising an interior and an exterior surface about the interior;
    disposing a coating along the exterior surface;
    heating the coating and the optical path material to diffuse the coating into the optical path material, the coating to minimize leakage of the light from the interior through the exterior surface;
    providing a body member including a cavity to receive a test fluid; and
    fitting the optical path material, with the coating having been diffused into the optical path material, into at least a portion of the body member to guide the light toward the cavity.

2. The method of claim 1, wherein the step of disposing the coating along the exterior surface comprises:
    sputter coating the coating along the exterior surface.

3. The method of claim 1, wherein the step of disposing comprises:
    diffusing the coating into the optical path material a distance based, at least in part, on a parameter of the light.

4. The method of claim 3, wherein the distance is about a wavelength of the light.

5. The method of claim 3, wherein the distance is less than a wavelength of the light.

6. The method of claim 3, wherein the distance is greater than a wavelength of the light.

7. The method of claim 1, wherein the coating comprises a metallic material.

8. The method of claim 1, wherein the coating is a first coating and the method further comprising:
   disposing a second coating along the first coating.

9. The method of claim 8, wherein the step of disposing the second coating is based, at least in part, on electroplating.

10. The method of claim 1, further comprising:
    polishing the first end surface and the second end surface.

* * * * *